United States Patent
Kris

(10) Patent No.: US 8,362,819 B1
(45) Date of Patent: Jan. 29, 2013

(54) SYNCHRONIZING MULTI-FREQUENCY PULSE WIDTH MODULATION GENERATORS

(75) Inventor: Bryan Kris, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/248,668

(22) Filed: Sep. 29, 2011

(51) Int. Cl.
*H03K 3/017* (2006.01)

(52) U.S. Cl. ......................................... 327/175; 327/172

(58) Field of Classification Search .................. None
See application file for complete search history.

(56) References Cited

U.S. PATENT DOCUMENTS

| | | | | |
|---|---|---|---|---|
| 5,631,592 A | * | 5/1997 | Schwarz et al. | 327/172 |
| 7,362,152 B2 | * | 4/2008 | Figoli | 327/172 |
| 7,714,626 B2 | * | 5/2010 | Kris | 327/175 |
| 7,791,386 B2 | * | 9/2010 | Kris | 327/160 |
| 2002/0190768 A1 | * | 12/2002 | Bowling | 327/175 |

* cited by examiner

*Primary Examiner* — Cassandra Cox
(74) *Attorney, Agent, or Firm* — King & Spalding L.L.P.

(57) ABSTRACT

A "quasi-master-time-base" circuit is used to periodically resynchronize the individual PWM generators to a know reference signal. This quasi-master-time-base will be at the lowest frequency relative to all of the PWM output frequencies, wherein all of the PWM output frequencies are at the same frequency or at an integer multiple frequency(ies) of the quasi-master frequency. This "quasi-master-time-base" circuit allows for minor timing errors due to user PWM configuration errors and/or update errors, and still yields stable PWM signal outputs that remain synchronized to each other.

5 Claims, 5 Drawing Sheets

SYNCHRONIZING MULTI-FREQUENCY PULSE WIDTH MODULATION GENERATORS

TECHNICAL FIELD

The present disclosure relates generally to generation of multi-frequency pulse width modulation signals, and more particularly to synchronizing the generated multi-frequency pulse width modulation signals.

BACKGROUND

Power conversion applications are becoming increasingly more sophisticated in having multiple sub-circuits that utilize multiple pulse width modulation (PWM) signal outputs that operate at different frequencies and are harmonically related to each other in frequency, i.e., integer frequency ratios. For example, one PWM signal frequency could be an integer multiple of another PWM signal frequency. Existing PWM generation technologies can generate these harmonically related PWM signal output frequencies, but since the counters in them are free running they are incapable of maintaining proper synchronization of the PWM signals in response to user configuration errors, update errors, phase offset changes, and/or in response to external asynchronous events such as an external synchronization signal that may cause an initial synchronization among the PWM signal outputs to be lost.

SUMMARY

Therefore, what is needed is a way to generate multi-frequency pulse width modulation (PWM) signals that maintain synchronization regardless of user or system events. According to the teachings of this disclosure, PWM signal synchronization is accomplished with a plurality of phase offset counters, a plurality of phase comparators, a plurality of local time base counters and a synchronization circuit that is triggered via a master time base.

A "quasi-master-time-base" circuit is used to periodically resynchronize the individual PWM generators to a know reference signal. This quasi-master-time-base will be at the lowest frequency relative to all of the PWM output frequencies, wherein all of the PWM output frequencies are at the same frequency or at an integer multiple frequency(ies) of the quasi-master frequency. Each individual PWM generator circuit may operate in a "single shot mode," completing their individual cycles and then waiting for a synchronization signal. If the PWM generator is busy with an existing PWM cycle, it ignores synchronization signal(s) until its existing PWM cycle has completed. This "quasi-master-time-base" circuit allows for minor timing errors due to user PWM configuration errors and/or update errors, and still yields stable PWM signal outputs that remain synchronized to each other.

According to a specific example embodiment of this disclosure, a pulse width modulation (PWM) generator (401) for generating a PWM signal that is synchronized with a master time base comprises: a duty cycle register (108) storing a duty cycle value; a duty cycle counter (402) having a clock input coupled to a clock generating a plurality of clock pulses, and incrementing a duty cycle count value for each of the plurality of clock pulses received; a duty cycle comparator (110) coupled to the duty cycle register (108) and the duty cycle counter (402) compares the duty cycle count value to the duty cycle value and generates a PWM signal when the duty cycle count value is less than or equal to the duty cycle value; a local period register (438) storing a local period value that determines the frequency of the PWM signal produced by the PWM generator (401); a local period comparator (424) coupled to the duty cycle counter (402) and the local period register (438) compares the duty cycle count value to the local period value and generates a logic high signal when the duty cycle value is equal to or greater than the local period value; a phase counter (426) having a clock input coupled to the clock and incrementing a phase count value for each of the plurality of clock pulses received; a phase offset register (412) storing a phase offset value; a phase offset comparator (428) coupled to the phase counter (426) and the phase offset register (412) compares the phase count value to the phase offset value and generates a logic high when the phase count value is equal to or greater than the phase offset value; the phase offset comparator (428) has an output coupled to a stop input of the phase counter (426) and when the output thereof is at a logic high the phase counter (426) is prevented from incrementing the phase count value for each of the plurality of clock pulses received; a cycle-in-process (CIP) flip-flop (432) having a clock input coupled to a PWM cycle start signal, a D-input coupled to a logic high and a reset input coupled to an inverted output of the duty cycle comparator (110); an edge detector circuit (434, 436) having a first input coupled to the clock, and a second input coupled to an output of the phase offset comparator (428); a first AND gate (430) having a first input coupled to the PWM cycle start signal and a second input coupled to an inverted output of the CIP flip-flop 432; a second AND gate (446) having a first input coupled to the local period comparator 424 and a second input coupled to an inverted single shot mode control signal; and an OR gate (422) having a first input coupled to an output of the edge detector circuit (434, 436), a second input coupled to an output of the second AND gate (438), and an output coupled to a reset input of the duty cycle counter (402), wherein the PWM cycle start signal is generated each time a period rollover event occurs, wherein if the inverted output of the CIP flip-flop (432) is a logic high at the second input of the first AND gate (430) and the PWM cycle start signal is a logic high at the first input of the first AND gate (430) then the phase count value is reset to zero and the inverted output of the CIP flip-flop (432) is set to a logic low, whereby all further ones of the PWM cycle start signal are ignored until the inverted output of the CIP flip-flop (432) is reset back to a logic high, wherein the phase counter (426) stops counting when the phase count value is equal to or greater than the phase offset value in the phase offset register (412), wherein when a single shot mode is disabled the duty cycle counter (402) is reset to zero when the duty cycle count value is equal to or greater than the local period value and a new duty cycle count starts, otherwise the duty cycle counter (402) is not reset when the duty cycle count value is equal to or greater than the local period value, and wherein if the duty cycle count value is equal to or greater than the duty cycle value then the CIP flip-flop (432) is reset so that the output thereof is at a logic high, then the duty cycle count value in the duty cycle counter (402) is reset to zero and a new duty cycle count starts.

According to another specific example embodiment of this disclosure, a system for generating a plurality of pulse width modulation (PWM) signals having extended phase offsets comprises: a master time base generator (500), wherein the master time base generator (500) comprises: a master period counter (502) having a clock input coupled to a clock generating a plurality of clock pulses, and incrementing a master count value for each of the plurality of clock pulses received; a master period register (504) having a master period value; a master period comparator (506) coupled to the master period register (504) and the master period counter (502), compares the master count value to the master period value, generates a PWM cycle start signal when the master count value is equal to or greater than the master period value, and then resets the master count value in the master period counter (502) to zero; and a plurality of pulse width modulation (PWM) generators (401) for generating a plurality of PWM signals having extended phase offsets, each of said plurality of PWM generators (401) comprises: a duty cycle register (108) storing a duty cycle value; a duty cycle counter (402) having a clock input coupled to the clock, and incrementing a duty cycle count value for each of the plurality of clock pulses received; a duty cycle comparator (110) coupled to the duty cycle register (108) and the duty cycle counter (402), compares the duty cycle count value to the duty cycle value, and generates a phase offset related PWM signal when the duty cycle count value is less than or equal to the duty cycle value; a local period register (438) storing a local period value that determines the frequency of the PWM signal produced by the PWM generator (401); a local period comparator (424) coupled to the duty cycle counter (402) and the local period register (438) compares the duty cycle count value to the local period value and generates a logic high signal when the duty cycle value is equal to or greater than the local period value; a phase counter (426) having a clock input coupled to the clock and incrementing a phase count value for each of the plurality of clock pulses received; a phase offset register (412) storing a phase offset value; a phase offset comparator (428) coupled to the phase counter (426) and the phase offset register (412), compares the phase count value to the phase offset value, and generates a logic high when the phase count value is equal to or greater than the phase offset value; the phase offset comparator (428) has an output coupled to a stop input of the phase counter (426) and when the output thereof is at a logic high the phase counter (426) is prevented from incrementing the phase count value for each of the plurality of clock pulses received; a cycle-in-process (CIP) flip-flop (432) having a clock input coupled to a PWM cycle start signal, a D-input coupled to a logic high and a reset input coupled to an inverted output of the duty cycle comparator (110); an edge detector circuit (434, 436) having a first input coupled to the clock, and a second input coupled to an output of the phase offset comparator (428); a first AND gate (430) having a first input coupled to the PWM cycle start signal and a second input coupled to an inverted output of the CIP flip-flop 432; a second AND gate (446) having a first input coupled to the local period comparator 424 and a second input coupled to an inverted single shot mode control signal; and an OR gate (422) having a first input coupled to an output of the edge detector circuit (434, 436), a second input coupled to an output of the local period comparator (424), and an output coupled to a reset input of the duty cycle counter (402), wherein the master time base generator (500) generates the PWM cycle start signal each time a period roll-over event occurs, wherein if the inverted output of the CIP flip-flop (432) is a logic high at the second input of the first AND gate (430) and the PWM cycle start signal is a logic high at the first input of the first AND gate (430) then the phase count value is reset to zero and the inverted output of the CIP flip-flop (432) is set to a logic low, whereby all further ones of the PWM cycle start signal are ignored until the inverted output of the CIP flip-flop (432) is reset back to a logic high, wherein the phase counter (426) stops counting when the phase count value is equal to or greater than the phase offset value in the phase offset register (412), wherein when a single shot mode is disabled the duty cycle counter (402) is reset to zero when the duty cycle count value is equal to or greater than the local period value and a new duty cycle count starts, otherwise the duty cycle counter (402) is not reset when the duty cycle count value is equal to or greater than the local period value, and wherein if the duty cycle count value is equal to or greater than the duty cycle value then the CIP flip-flop (432) is reset so that the output thereof is at a logic high, then the duty cycle count value in the duty cycle counter (402) is reset to zero and a new duty cycle count starts.

According to yet another specific example embodiment of this disclosure, a method for generating a plurality of pulse width modulation (PWM) signals having extended phase offsets comprises the steps of: providing a master count value from a master period counter (502), wherein the master count value is incremented for each one of a plurality of clock pulses received by the master period counter (502); providing a master period value in a master period register (504); comparing the master count value to the master period value with a master period comparator (506); generating a PWM cycle start signal when the master count value is equal to or greater than the master period value, and then resetting the master count value in the master period counter (502) to zero; generating a plurality of phase offset related PWM signals with a plurality of pulse width modulation (PWM) generators (401), wherein generating each of the plurality of phase offset related PWM signals comprises the steps of: storing a duty cycle value in a duty cycle register (108); incrementing a duty cycle count value with a duty cycle counter (402) for each one of the plurality of clock pulses received by the duty cycle counter (402); comparing the duty cycle count value to the duty cycle value with a duty cycle comparator (110); generating the one of the plurality of phase offset related PWM signals when the compared duty cycle count value is less than or equal to the duty cycle value; comparing the duty cycle count value to the master period value with a local period comparator (424); generating a logic high with the local period comparator (424) when the duty cycle value is equal to or greater than the master period value; incrementing a phase count value in a phase counter (426) for each of the plurality of clock pulses received by the phase counter (426); storing a phase offset value in a phase offset register (412); comparing the phase count value to the phase offset value with a phase offset comparator (428); generating a logic high from the phase offset comparator (428) when the phase count value is equal to or greater than the phase offset value; preventing incrementing the phase count value for each of the plurality of clock pulses received when an output from the phase offset comparator (428) is at a logic high; generating the PWM cycle start signal each time a period roll-over event occurs; suspending counting in the phase counter (426) when the phase count value is equal to or greater than the phase offset value; resetting the duty cycle count value in the duty cycle counter (402) to zero when the phase count value is equal to or greater than the phase offset value; resetting the duty cycle count value in the duty cycle counter (402) to zero when the duty cycle count value is equal to or greater than the local period value and a single shot mode is disabled; and then starting a new duty cycle count.

BRIEF DESCRIPTION OF THE DRAWINGS

A more complete understanding of the present disclosure thereof may be acquired by referring to the following description taken in conjunction with the accompanying drawings wherein.

Figure 1:
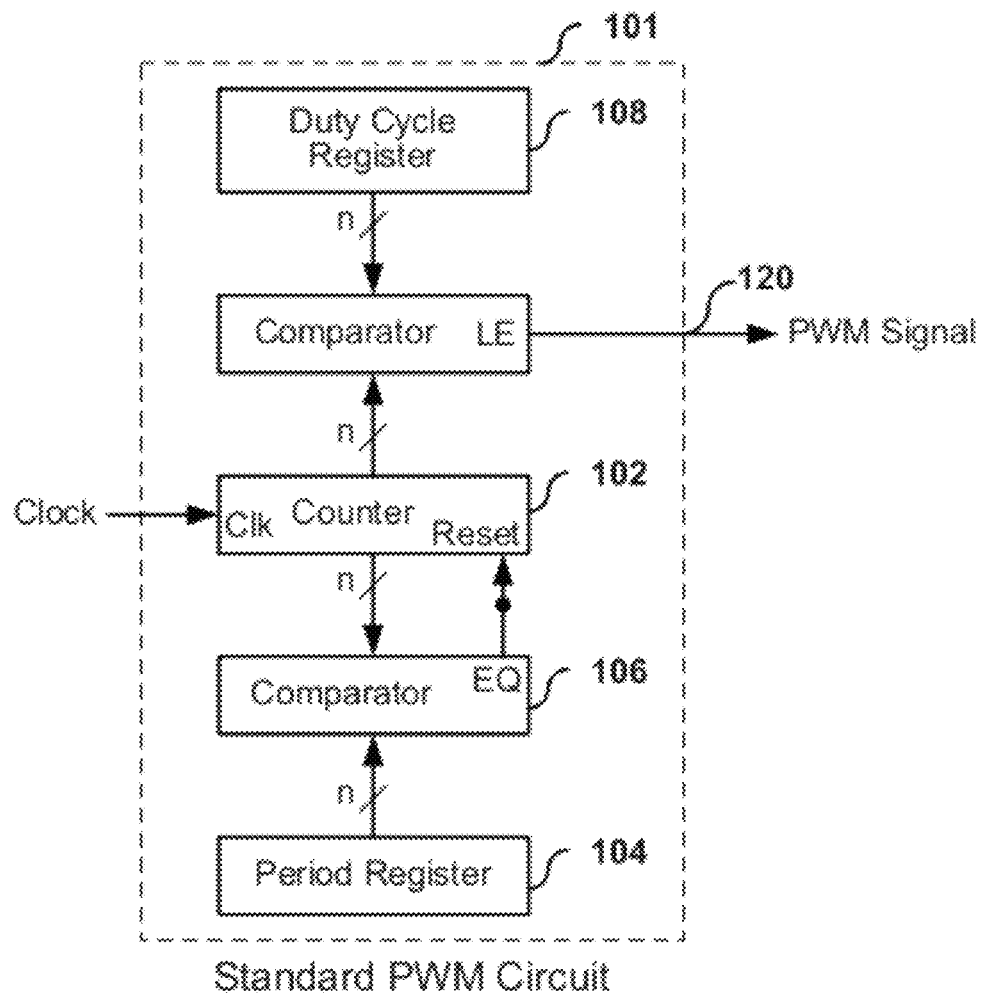
FIG. 1 illustrates a typical pulse width modulation (PWM) generator circuit.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of an example embodiment is schematically illustrated. Like elements in the drawings will be represented by like numbers, and similar elements will be represented by like numbers with a different lower case letter suffix.

Referring to FIG. 1, depicted is a typical pulse width modulation (PWM) generator circuit. The PWM generator circuit 101 comprises a timer/counter 102, a period register 104, a comparator 106 and a duty cycle register 108. The timer/counter 102 counts up from zero until it reaches a value specified by the period register 104 as determined by the comparator 106. The period register 104 contains a user specified value which represents the maximum counter value that determines the PWM period. When the timer/counter 102 matches the value in the period register 104, the timer/counter 102 is cleared by a reset signal from the comparator 106, and the cycle repeats. The duty cycle register 108 stores the user specified duty cycle value. A PWM output signal 120 is asserted (driven high) whenever the timer/counter 102 value is less than the duty cycle value stored in the duty cycle register 108. The PWM output signal 120 is de-asserted (driven low) when the timer/counter value 102 is equal to or greater than the duty cycle value stored in the duty cycle register 108.

Figure 2:
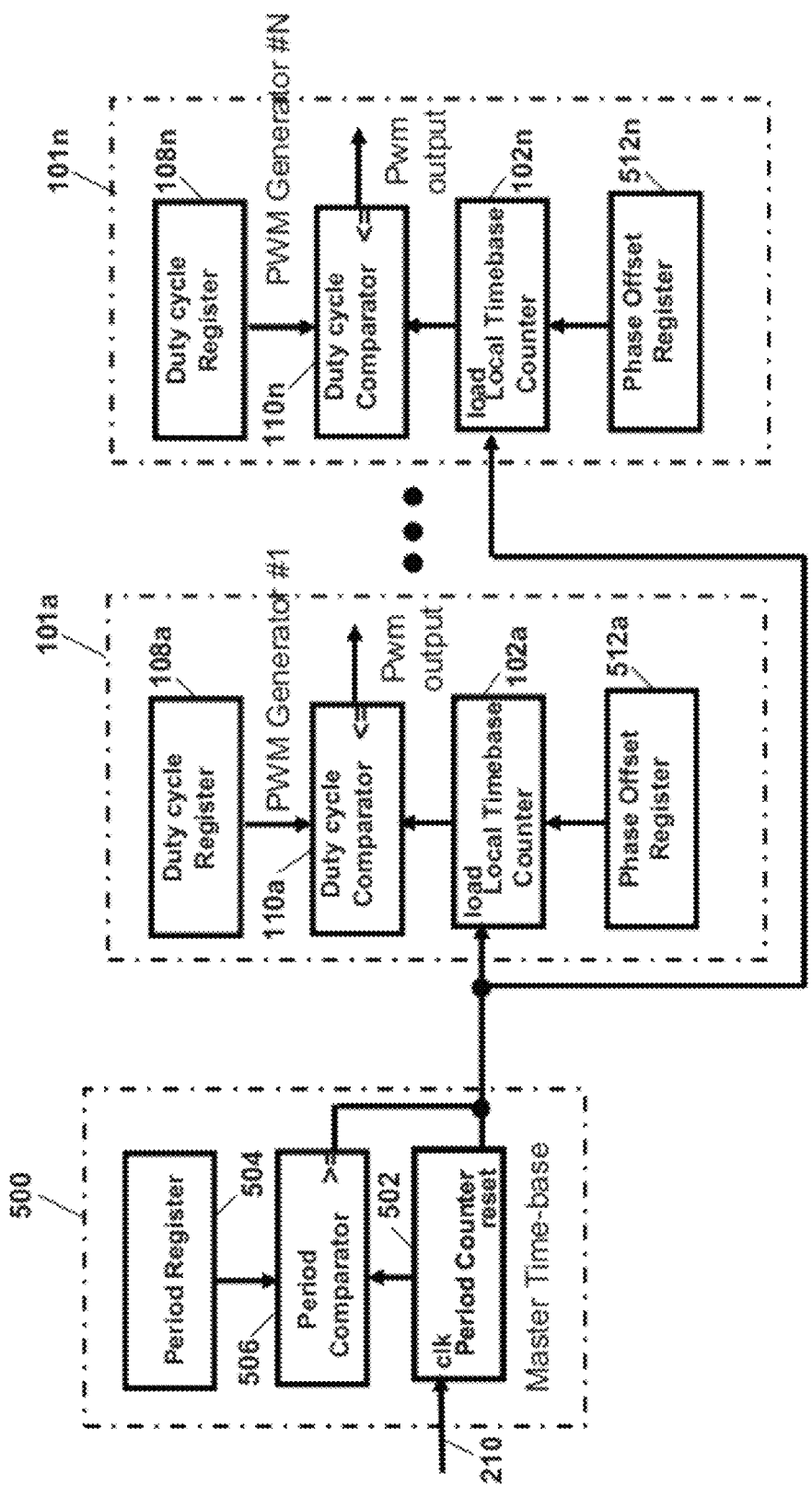
FIG. 2 illustrates a schematic block diagram of a multiphase PWM signal generation circuit having a master time base and used for generating groups of synchronized PWM signals having phase offsets between each of the PWM signals.

Referring to FIG. 2, depicted is a schematic block diagram of a multiphase PWM signal generation circuit having a master time base and used for generating groups of synchronized PWM signals having phase offsets between each of the PWM signals. The multiphase PWM generation circuit comprises a master time base 500 and a plurality of PWM generators 101. The master time base 500 comprises a period register 504, period comparator 506 and a period counter 502 that control the period of each of the PWM signal phases of the PWM generators 101a-101n. Each of the PWM generators 101 comprises a phase offset register 512 used to determine the phase offset of the respective PWM output signal from each of the PWM generators 101. The PWM period register 504, duty cycle register 108 and phase-offset register 512 are programmed to values required to obtain a desired operating frequency (period), duty cycle and phase-offset, respectively. The local time base counters 102 are synchronized to the master time base 500. The individual PWM signal outputs may differ in phase (determined by the phase offset register 512) but not in frequency (period).

Figure 3:
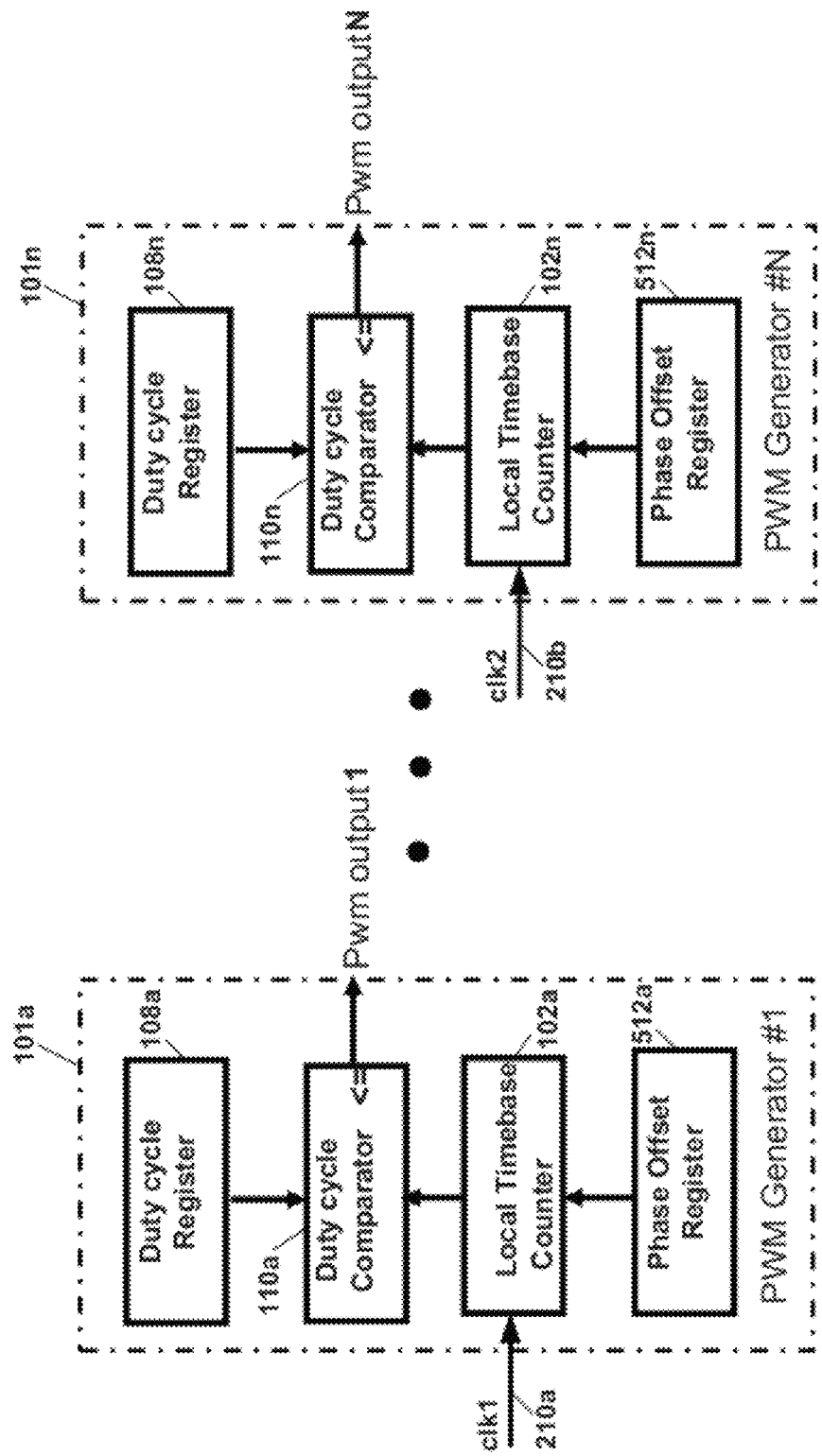
FIG. 3 illustrates a schematic block diagram of a PWM signal generation circuit for generating a plurality of PWM signals capable of having differing frequencies.

Referring to FIG. 3, depicted is a schematic block diagram of a PWM signal generation circuit for generating a plurality of PWM signals capable of having differing frequencies. Each of the PWM generator circuits 101 comprises a phase offset register 512 that is used to determine the phase offset of a respective PWM output signal from each of the PWM generators 101. The duty cycle and phase-offset PWM registers 108 and 512, respectively, are programmed to values required to obtain a desired duty cycle and phase-offset for each of the PWM outputs. The local time base counters 102 allow the individual PWM generator circuits 101 to operate at different frequencies but these frequencies are independent and are not synchronized.

Figure 4:
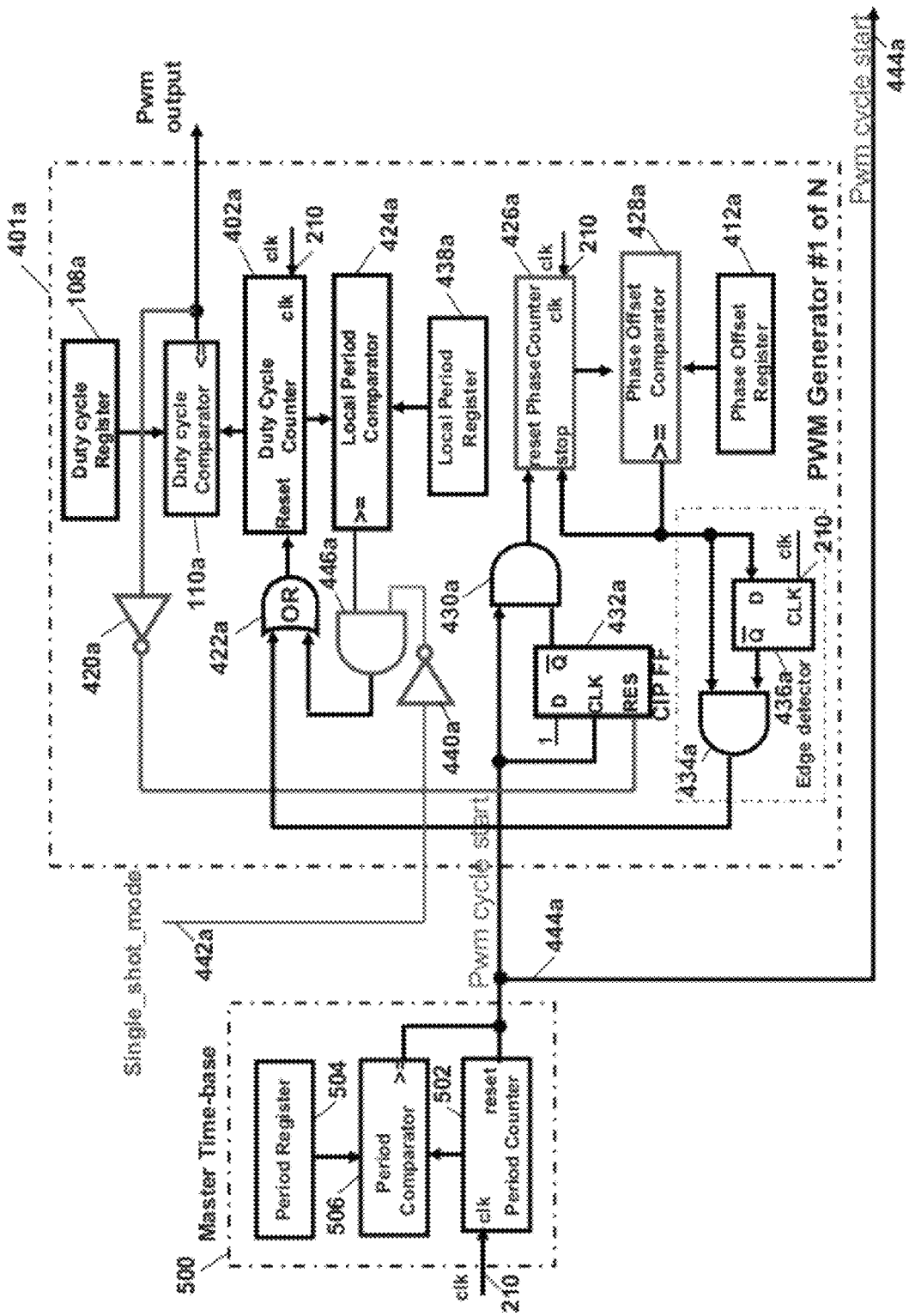
FIG. 4 illustrates a schematic block diagram of a multi-frequency synchronized PWM signal generation circuit for generating PWM signals having harmonically related frequencies, according to a specific example embodiment of this disclosure.

Referring to FIG. 4, depicted is a schematic block diagram of a multi-frequency synchronized PWM signal generation circuit for generating PWM signals having harmonically related frequencies, according to a specific example embodiment of this disclosure. A master time-base generation circuit 500 comprises a master time-base period counter 502, a master time-base period register 504, and a master time-base period comparator 506.

The master time-base generation circuit 500 generates a PWM cycle start signal at a logic "high" or "1" each time the master time-base period counter 502 reaches its terminal count and rolls over to zero (period roll-over event). The PWM cycle start signal is coupled to each of the PWM generator circuits 401. If the cycle-in-process (CIP) flip-flop 432 is reset (Q\-output at a logic "1") and a PWM cycle start signal is received, then the phase counter 426 is reset and the associated CIP flip-flop 432 is set (Q\-output at a logic "0"). Wherein during the time that the CIP flip-flop 432 is set and a PWM cycle start signal is received, nothing further happens (AND gate 430 blocks a reset signal to the phase counter 426). The terms "local time base counter" and "duty cycle counter" 402 will be used interchangeable herein.

If the value in the phase counter 426 is less than the value in the phase offset register 412, then the phase counter 426 continues to count up. When the value in the phase counter 426 is equal to or greater than the value in the phase offset register 412, the phase counter 426 stops counting and the associated local time base counter (duty cycle counter) 402 is reset when the phase counter 426 reaches its terminal count, e.g., via the edge detect circuit comprising flip-flop 436 and AND gate 434. When the value of the local time base counter (duty cycle counter) 402 is equal to or greater than the value in the duty cycle register 108, the CIP flip-flop 432 is reset (cleared)(Q\-output at a logic "1") and is ready (armed) to accept the next received PWM cycle start signal and then starts at the beginning of the above described process again. However, the local time base counter (duty cycle counter) 402 may continue to rollover and start new PWM cycles.

When in the "single shot mode" the duty cycle counter 402 is reset only when there is an edge detect signal from the AND gate 434 (generated by a logic high output from the phase offset comparator 428). When not in the "single shot mode" (single shot mode signal 442 at a logic zero) the duty cycle counter 402 may be reset either as described above or when the count value in the duty cycle counter 402 is equal to or greater than the value in the local period register 438, at which time a logic high output from the local period comparator 424 will reset the duty cycle counter 402.

Figure 5:
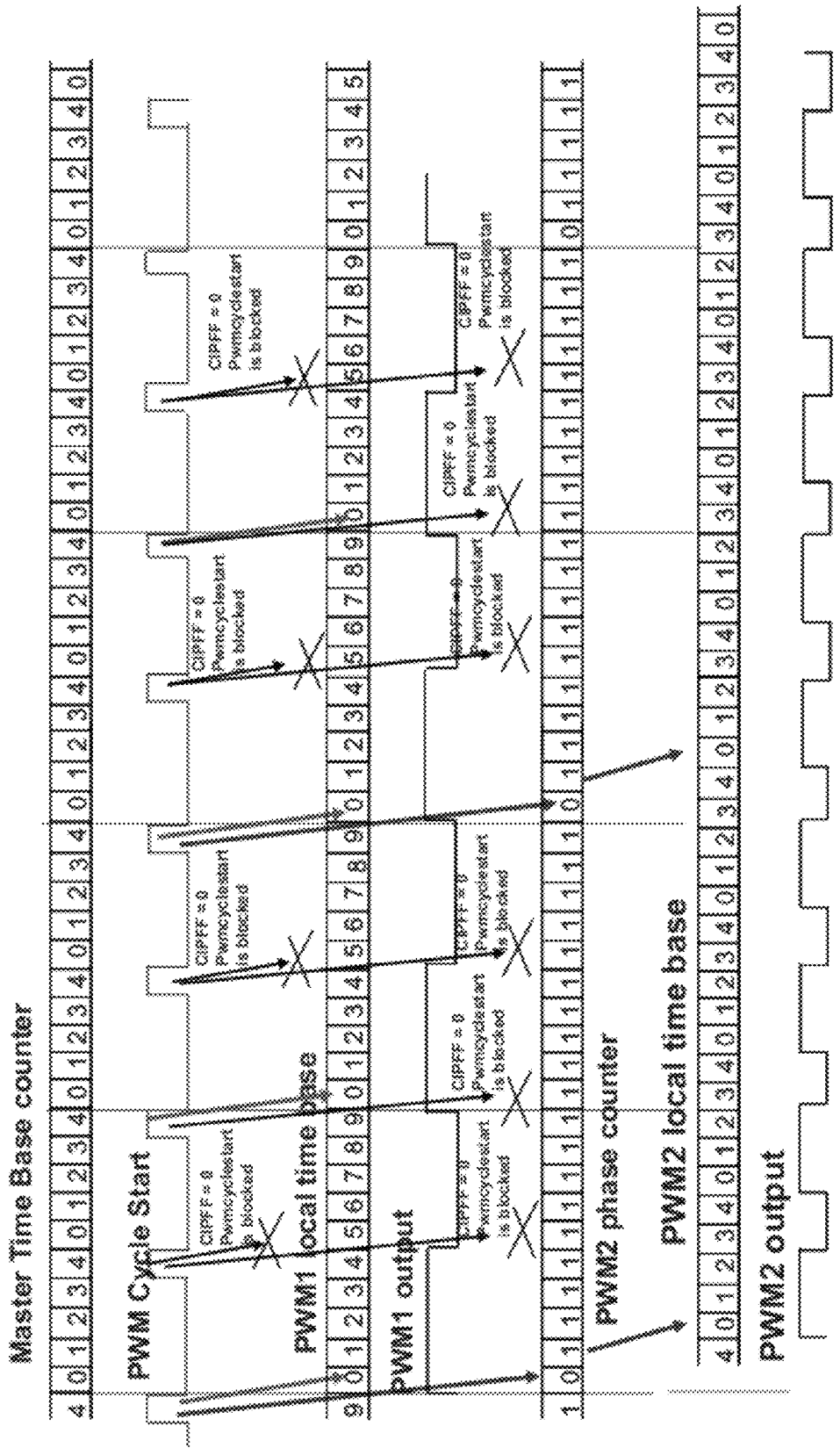
FIG. 5 illustrates a schematic timing diagram of the multi-frequency synchronized PWM signal generation circuit shown in FIG. 4.

Referring to FIG. 5, depicted is a schematic timing diagram of the multi-frequency synchronized PWM signal generation circuit shown in FIG. 4. The individual PWM generators 401 block sync signals if they are busy While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A pulse width modulation (PWM) generator (401) for generating a PWM signal that is synchronized with a master time base, comprising:
    a duty cycle register (108) storing a duty cycle value;
    a duty cycle counter (402) having a clock input coupled to a clock generating a plurality of clock pulses, and incrementing a duty cycle count value for each of the plurality of clock pulses received;
    a duty cycle comparator (110) coupled to the duty cycle register (108) and the duty cycle counter (402) compares the duty cycle count value to the duty cycle value and generates a PWM signal when the duty cycle count value is less than or equal to the duty cycle value;
    a local period register (438) storing a local period value that determines the frequency of the PWM signal produced by the PWM generator (401);
    a local period comparator (424) coupled to the duty cycle counter (402) and the local period register (438) compares the duty cycle count value to the local period value and generates a logic high signal when the duty cycle value is equal to or greater than the local period value;
    a phase counter (426) having a clock input coupled to the clock and incrementing a phase count value for each of the plurality of clock pulses received;
    a phase offset register (412) storing a phase offset value;
    a phase offset comparator (428) coupled to the phase counter (426) and the phase offset register (412) compares the phase count value to the phase offset value and generates a logic high when the phase count value is equal to or greater than the phase offset value;
    the phase offset comparator (428) has an output coupled to a stop input of the phase counter (426) and when the output thereof is at a logic high the phase counter (426) is prevented from incrementing the phase count value for each of the plurality of clock pulses received;
    a cycle-in-process (CIP) flip-flop (432) having a clock input coupled to a PWM cycle start signal, a D-input coupled to a logic high and a reset input coupled to an inverted output of the duty cycle comparator (110);
    an edge detector circuit (434, 436) having a first input coupled to the clock, and a second input coupled to an output of the phase offset comparator (428);
    a first AND gate (430) having a first input coupled to the PWM cycle start signal and a second input coupled to an inverted output of the CIP flip-flop 432;
    a second AND gate (446) having a first input coupled to the local period comparator 424 and a second input coupled to an inverted single shot mode control signal; and
    an OR gate (422) having a first input coupled to an output of the edge detector circuit (434, 436), a second input coupled to an output of the second AND gate (438), and an output coupled to a reset input of the duty cycle counter (402),
    wherein the PWM cycle start signal is generated each time a period roll-over event occurs,
    wherein if the inverted output of the CIP flip-flop (432) is a logic high at the second input of the first AND gate (430) and the PWM cycle start signal is a logic high at the first input of the first AND gate (430) then the phase count value is reset to zero and the inverted output of the CIP flip-flop (432) is set to a logic low, whereby all further ones of the PWM cycle start signal are ignored until the inverted output of the CIP flip-flop (432) is reset back to a logic high,
    wherein the phase counter (426) stops counting when the phase count value is equal to or greater than the phase offset value in the phase offset register (412),
    wherein when a single shot mode is disabled the duty cycle counter (402) is reset to zero when the duty cycle count value is equal to or greater than the local period value and a new duty cycle count starts, otherwise the duty cycle counter (402) is not reset when the duty cycle count value is equal to or greater than the local period value, and
    wherein if the duty cycle count value is equal to or greater than the duty cycle value then the CIP flip-flop (432) is reset so that the output thereof is at a logic high, then the duty cycle count value in the duty cycle counter (402) is reset to zero and a new duty cycle count starts.

2. The PWM generator according to claim 1, wherein the edge detector circuit (434, 436) comprises:
    a D flip-flop (436) having a clock input coupled to the clock and a D-input coupled to an output of the phase offset comparator (428); and
    a third AND gate (434) having a first input coupled to the output of the phase offset comparator (428), a second input coupled to an inverted output of the D flip-flop (436), and an output coupled to the first input of the OR gate (422).

3. A system for generating a plurality of pulse width modulation (PWM) signals having extended phase offsets, said system comprising:
    a master time base generator (500), wherein the master time base generator (500) comprises:
        a master period counter (502) having a clock input coupled to a clock generating a plurality of clock pulses, and incrementing a master count value for each of the plurality of clock pulses received;
        a master period register (504) having a master period value;
        a master period comparator (506) coupled to the master period register (504) and the master period counter (502), compares the master count value to the master period value, generates a PWM cycle start signal when the master count value is equal to or greater than the master period value, and then resets the master count value in the master period counter (502) to zero; and
    a plurality of pulse width modulation (PWM) generators (401) for generating a plurality of PWM signals having extended phase offsets, each of said plurality of PWM generators (401) comprises:
        a duty cycle register (108) storing a duty cycle value;

a duty cycle counter (402) having a clock input coupled to the clock, and incrementing a duty cycle count value for each of the plurality of clock pulses received;

a duty cycle comparator (110) coupled to the duty cycle register (108) and the duty cycle counter (402), compares the duty cycle count value to the duty cycle value, and generates a phase offset related PWM signal when the duty cycle count value is less than or equal to the duty cycle value;

a local period register (438) storing a local period value that determines the frequency of the PWM signal produced by the PWM generator (401);

a local period comparator (424) coupled to the duty cycle counter (402) and the local period register (438) compares the duty cycle count value to the local period value and generates a logic high signal when the duty cycle value is equal to or greater than the local period value;

a phase counter (426) having a clock input coupled to the clock and incrementing a phase count value for each of the plurality of clock pulses received;

a phase offset register (412) storing a phase offset value;

a phase offset comparator (428) coupled to the phase counter (426) and the phase offset register (412), compares the phase count value to the phase offset value, and generates a logic high when the phase count value is equal to or greater than the phase offset value;

the phase offset comparator (428) has an output coupled to a stop input of the phase counter (426) and when the output thereof is at a logic high the phase counter (426) is prevented from incrementing the phase count value for each of the plurality of clock pulses received;

a cycle-in-process (CIP) flip-flop (432) having a clock input coupled to a PWM cycle start signal, a D-input coupled to a logic high and a reset input coupled to an inverted output of the duty cycle comparator (110);

an edge detector circuit (434, 436) having a first input coupled to the clock, and a second input coupled to an output of the phase offset comparator (428);

a first AND gate (430) having a first input coupled to the PWM cycle start signal and a second input coupled to an inverted output of the CIP flip-flop 432;

a second AND gate (446) having a first input coupled to the local period comparator 424 and a second input coupled to an inverted single shot mode control signal; and an OR gate (422) having a first input coupled to an output of the edge detector circuit (434, 436), a second input coupled to an output of the local period comparator (424), and an output coupled to a reset input of the duty cycle counter (402), wherein the master time base generator (500) generates the PWM cycle start signal each time a period roll-over event occurs, wherein if the inverted output of the CIP flip-flop (432) is a logic high at the second input of the first AND gate (430) and the PWM cycle start signal is a logic high at the first input of the first AND gate (430) then the phase count value is reset to zero and the inverted output of the CIP flip-flop (432) is set to a logic low, whereby all further ones of the PWM cycle start signal are ignored until the inverted output of the CIP flip-flop (432) is reset back to a logic high, wherein the phase counter (426) stops counting when the phase count value is equal to or greater than the phase offset value in the phase offset register (412), wherein when a single shot mode is disabled the duty cycle counter (402) is reset to zero when the duty cycle count value is equal to or greater than the local period value and a new duty cycle count starts, otherwise the duty cycle counter (402) is not reset when the duty cycle count value is equal to or greater than the local period value, and wherein if the duty cycle count value is equal to or greater than the duty cycle value then the CIP flip-flop (432) is reset so that the output thereof is at a logic high, then the duty cycle count value in the duty cycle counter (402) is reset to zero and a new duty cycle count starts.

4. The system according to claim 3, wherein the edge detector circuit (434, 436) comprises:

a D flip-flop (436) having a clock input coupled to the clock and a D-input coupled to an output of the phase offset comparator (428); and a third AND gate (434) having a first input coupled to the output of the phase offset comparator (428), a second input coupled to an inverted output of the D flip-flop (436), and an output coupled to the first input of the OR gate (422).

5. A method for generating a plurality of pulse width modulation (PWM) signals having extended phase offsets, said method comprising the steps of:

providing a master count value from a master period counter (502), wherein the master count value is incremented for each one of a plurality of clock pulses received by the master period counter (502);

providing a master period value in a master period register (504);

comparing the master count value to the master period value with a master period comparator (506);

generating a PWM cycle start signal when the master count value is equal to or greater than the master period value, and then resetting the master count value in the master period counter (502) to zero;

generating a plurality of phase offset related PWM signals with a plurality of pulse width modulation (PWM) generators (401), wherein generating each of the plurality of phase offset related PWM signals comprises the steps of:

storing a duty cycle value in a duty cycle register (108);

incrementing a duty cycle count value with a duty cycle counter (402) for each one of the plurality of clock pulses received by the duty cycle counter (402);

comparing the duty cycle count value to the duty cycle value with a duty cycle comparator (110);

generating the one of the plurality of phase offset related PWM signals when the compared duty cycle count value is less than or equal to the duty cycle value;

comparing the duty cycle count value to the master period value with a local period comparator (424);

generating a logic high with the local period comparator (424) when the duty cycle value is equal to or greater than the master period value;

incrementing a phase count value in a phase counter (426) for each of the plurality of clock pulses received by the phase counter (426);

storing a phase offset value in a phase offset register (412);

comparing the phase count value to the phase offset value with a phase offset comparator (428);

generating a logic high from the phase offset comparator (428) when the phase count value is equal to or greater than the phase offset value;

preventing incrementing the phase count value for each of the plurality of clock pulses received when an output from the phase offset comparator (428) is at a logic high;

generating the PWM cycle start signal each time a period roll-over event occurs;

suspending counting in the phase counter (426) when the phase count value is equal to or greater than the phase offset value;

resetting the duty cycle count value in the duty cycle counter (402) to zero when the phase count value is equal to or greater than the phase offset value;

resetting the duty cycle count value in the duty cycle counter (402) to zero when the duty cycle count value is equal to or greater than the local period value and a single shot mode is disabled; and then starting a new duty cycle count.

* * * * *